(12) United States Patent
Komiyama et al.

(10) Patent No.: US 6,900,076 B2
(45) Date of Patent: May 31, 2005

(54) METHODS FOR MANUFACTURING SEMICONDUCTOR CHIPS, METHODS FOR MANUFACTURING SEMICONDUCTOR DEVICES, SEMICONDUCTOR CHIPS, SEMICONDUCTOR DEVICES, CONNECTION SUBSTRATES AND ELECTRONIC DEVICES

(75) Inventors: Tadashi Komiyama, Kofu (JP); Akitoshi Hara, Fujimi-machi (JP); Eiichi Sato, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 09/776,528

(22) Filed: Feb. 4, 2001

(65) Prior Publication Data

US 2001/0021582 A1 Sep. 13, 2001

(30) Foreign Application Priority Data

Feb. 4, 2000 (JP) .................................. 2000-028366
Jan. 23, 2001 (JP) .................................. 2001-014025

(51) Int. Cl.⁷ ............................................. H01L 21/48
(52) U.S. Cl. ..................... 438/118; 257/758; 257/759; 257/782
(58) Field of Search ........................... 438/118, 622, 438/612, 108, 597, 667; 257/758, 759, 782, 774, 686, 777, 621, 734

(56) References Cited

U.S. PATENT DOCUMENTS

| | | | | |
|---|---|---|---|---|
| 4,447,291 A | * | 5/1984 | Schulte | 438/704 |
| 5,051,811 A | * | 9/1991 | Williams et al. | 357/68 |
| 5,422,435 A | | 6/1995 | Takiar et al. | 174/52.4 |
| 5,737,052 A | * | 4/1998 | Kimura | 349/149 |
| 5,805,427 A | * | 9/1998 | Hoffman | 361/770 |
| 5,994,763 A | * | 11/1999 | Ohmuro | 257/621 |
| 6,002,147 A | * | 12/1999 | Iovdalsky et al. | 257/276 |
| 6,114,221 A | * | 9/2000 | Tonti et al. | 438/455 |
| 6,300,670 B1 | * | 10/2001 | Kramer et al. | 257/621 |
| 6,465,893 B1 | * | 10/2002 | Khandros et al. | 257/777 |
| 6,468,889 B1 | * | 10/2002 | Iacoponi et al. | 438/597 |
| 6,469,897 B2 | * | 10/2002 | Ho et al. | 361/704 |

FOREIGN PATENT DOCUMENTS

| | | | | |
|---|---|---|---|---|
| EP | 0 575051 | | 12/1993 | ......... H01L/25/065 |
| JP | 6-37250 | | 2/1994 | ......... H01L/25/065 |
| JP | 06029376 A | * | 2/1994 | ......... H01L/21/76 |

* cited by examiner

*Primary Examiner*—Long Pham
*Assistant Examiner*—Nathan W. Ha
(74) *Attorney, Agent, or Firm*—Konrad Raynes & Victor, LLP; Alan S. Raynes (57) ABSTRACT

Certain embodiments of the present invention relate to a method for manufacturing a semiconductor chip, a method for manufacturing a semiconductor device, a semiconductor chip, a semiconductor device, a connection substrate and an electronic apparatus, in which semiconductor chips stacked in layers are electrically connected to one another without using wires. In one embodiment, after an electrode 18 is formed on a surface 16 of a first semiconductor chip 12, a hole 26 is formed from an opposite surface 24 thereof until a tungsten layer 20 of the electrode 18 is exposed. A protrusion 30 is formed by etching on a surface 31 of a second semiconductor chip 14 and thereafter an abutting electrode 32 is formed on an apex section of the protrusion 30. The first semiconductor chip 12 and the second semiconductor chip 14 are stacked on top of the other such that the abutting electrode 32 contacts the electrode 18. As a result, the path between the electrodes becomes shorter and therefore signal delays are inhibited or prevented. Also, there are no restrictions on the area of semiconductor chips to be stacked. As a result, semiconductor chips having the same area can be stacked in layers, and thus the size of the semiconductor device 10 can be reduced.

26 Claims, 6 Drawing Sheets

10 : Semiconductor device    16 : Surface
12 : First semiconductor chip    18 : Electrode
14 : Second semiconductor chip    32 : Abutting electrode

METHODS FOR MANUFACTURING SEMICONDUCTOR CHIPS, METHODS FOR MANUFACTURING SEMICONDUCTOR DEVICES, SEMICONDUCTOR CHIPS, SEMICONDUCTOR DEVICES, CONNECTION SUBSTRATES AND ELECTRONIC DEVICES

Japanese Patent Application No. 2000-28366, filed Feb. 4, 2000, is hereby incorporated by reference in its entirety. Japanese Patent Application No. 2001-14025, filed Jan. 23, 2001, is hereby incorporated by reference in its entirety.

1. Technical Field

The present invention relates to methods for manufacturing semiconductor chips, methods for manufacturing semiconductor devices, semiconductor chips, semiconductor devices, connection substrates and electronic devices. More particularly, certain embodiments of the present invention relate to a method for manufacturing a semiconductor chip, a method for manufacturing a semiconductor device, a semiconductor chip, a semiconductor device, a connection substrate and an electronic apparatus, which inhibit or prevent electrical signal delays and promote the device miniaturization.

2. Related Art

In pursuit of greater performance and smaller size in electronic devices in recent years, a multiple package in which a plurality of semiconductor chips are disposed in one package is provided to achieve a higher performance and a smaller size in a semiconductor device. The multiple packages include those in which a plurality of semiconductor chips are arranged in plane, and those in which a plurality of semiconductor chips are stacked in layers in the thickness direction. Multiple packages with a plurality of semiconductor chips arranged in plane require a wide mounting area, and thus have a smaller contribution to the miniaturization of electronic devices. In this respect, stacked MCPs with stacked layered semiconductor chips are actively developed.

A conventional stacked MCP is described in, for example, Japanese laid-open patent application HEI 6-37250. As described in the reference, when stacked semiconductor chips are electrically connected to one another, terminals of the respective chips are connected by wires. As a result, the electrical connections between the mutual semiconductor chips is complicated. Moreover, the higher the semiconductor chips are provided in the stacked layers, the more the semiconductor chips need to be reduced in size. This lowers the integration efficiency and the mounting efficiency. Also, when the integration of semiconductor chips is increased, gaps between the wires become smaller such that short-circuits may occur between the wires.

Furthermore, in the conventional stacked MCPs, the semiconductor chips in the stacked layer are mutually bonded by an adhesive. This structure necessitates the steps including coating an adhesive and the like and complicates the process.

SUMMARY

One embodiment relates to a method for manufacturing a semiconductor chip, the method including forming an electrode on a surface of a semiconductor chip, and then digging a hole from another surface of the semiconductor chip until the electrode is exposed.

Another embodiment relates to a method for manufacturing a semiconductor chip. The method includes forming an electrode on a surface of a first semiconductor chip and thereafter forming a hole from an opposite surface of the first semiconductor chip until the electrode is exposed. The method also includes forming a protrusion by etching a surface of a second semiconductor chip and thereafter forming an abutting electrode on an apex section of the protrusion. The first semiconductor chip and the second semiconductor chip are then positioned such that the abutting electrode contacts the electrode.

Another embodiment relates to a method for manufacturing a semiconductor device. The method includes forming a metal film on a surface of a first semiconductor chip. A hole is formed through the first semiconductor chip by an anodic forming method using a resist coated on an opposite surface of the first semiconductor chip as a mask. The metal film is then removed and an electrode formed on a portion of the surface of the first semiconductor chip in a manner to embed the hole.

Another embodiment relates to a semiconductor chip including an electrode formed on a surface thereof and a hole that exposes the electrode through an opposite surface thereof.

Another embodiment relates to a semiconductor device including a first semiconductor chip having a first electrode formed on a surface thereof and a hole through the first semiconductor chip that exposes the electrode. The device also includes a second semiconductor chip having a protrusion for insertion in the hole through the first semiconductor chip and an abutting electrode on the protrusion adapted to contact the first electrode.

Another embodiment relates to a semiconductor device including a first substrate having a first electrode thereon and an opening extending through said first substrate, the opening positioned so that the first electrode extends across the opening. The device also includes a second substrate including a protrusion on which a second electrode is located; wherein the protrusion extends into the opening and the second electrode is electrically connected to the first electrode.

Yet another embodiment relates to a method for forming a semiconductor device, including forming a first electrode on a first surface of a first substrate and forming an opening from another surface of the first substrate to the first surface, wherein a portion of the first electrode is exposed through the opening. The method also includes forming a second electrode on a second substrate, and positioning the second electrode in the opening and electrically connecting the first electrode to the second electrode.

BRIEF DESCRIPTION OF THE DRAWINGS

Embodiments of the invention are described with reference to the accompanying drawings which, for illustrative purposes, are schematic and not necessarily drawn to scale.

FIGS. 1(1)–1(4) show steps of forming a first semiconductor chip 12 in accordance with an embodiment of the present invention.

FIGS. 2(1)–2(4) show steps of forming a second semiconductor chip 14 in accordance with an embodiment of the present invention.

FIGS. 3(1)–3(2) show cross-sectional views of a first semiconductor chip and a second semiconductor chip that are connected to one another in accordance with an embodiment of the present invention.

FIGS. 4(1)–4(4) show manufacturing steps in which monocrystal silicon having a crystal orientation face of (110) is used for a first semiconductor chip 12 in accordance with an embodiment of the present invention.

FIGS. 6(1)–6(4) show manufacturing steps for forming a metal film in the holes 26 of the first semiconductor chip in accordance with an embodiment of the present invention.

DETAILED DESCRIPTION

Certain embodiments of the present invention are designed to overcome at least some of the problems of the conventional technique, and it is an object of certain embodiments of the present invention to electrically connect semiconductor chips in stacked layers to one another without using wires.

One embodiment relates to a method for manufacturing a semiconductor chip and is characterized in comprising the steps of forming an electrode on a surface of a semiconductor chip, and then digging a hole from another surface such as a rear or opposite surface of the semiconductor chip until the electrode is exposed. A conduction member may be inserted in the hole formed in the semiconductor chip, and the conduction member is brought in contact with the electrode to establish electrical conduction between the two. As a result, the path between the electrodes becomes shorter and therefore signal delays are inhibited or prevented.

A method for manufacturing a semiconductor chip in accordance with another embodiment is characterized in comprising: forming an electrode on a surface of a first semiconductor chip and thereafter digging a hole from another surface such as, for example, an opposite surface of the first semiconductor chip, until the electrode is exposed, forming a protrusion by etching on a surface of a second semiconductor chip and thereafter forming an abutting electrode on an apex section of the protrusion, and superposing the first semiconductor chip and the second semiconductor chip such that the abutting electrode contacts the electrode. The protrusion formed on the surface of the second semiconductor chip may be inserted in the hole formed in the first semiconductor chip, and the abutting electrode that is formed at the apex section (the tip) of the protrusion formed on the surface of the second semiconductor chip is brought in contact with the electrode. In this manner, the first semiconductor chip and the second semiconductor chip are superimposed on top of the other to establish electrical conduction between the electrode and the abutting electrode. As a result, the path between the electrodes becomes shorter and therefore signal delays are inhibited or prevented. Also, there are no restrictions on the area of semiconductor chips to be superimposed. As a result, semiconductor chips having the same area can be stacked in layers, and thus the size of the apparatus main body can be miniaturized.

A method for manufacturing a semiconductor device according to another embodiment is characterized in comprising: forming a metal film on a surface of a first semiconductor chip, forming a hole by an anodic forming method using a dielectric layer such as a resist layer coated on a opposite surface of the first semiconductor chip as a mask, thereafter removing the metal film, and forming an electrode on a surface of the first semiconductor chip in a manner to embed the hole. By this method for manufacturing a semiconductor device, an anodic forming method is used to form the hole. As a result, the time required for forming the hole is substantially shortened (for example, as compared to the etching speed).

Furthermore, in another aspect of certain embodiments, after the hole is formed, a metal film is grown on the electrode from the opposite surface. The metal film protects the electrode. Therefore, when the first semiconductor chip and the second semiconductor chip are superimposed on top of the other, the occurrence of damage to the electrode, which may be caused by the abutting electrode being brought in contact with the electrode, is prevented.

A semiconductor chip according to another embodiment is characterized in comprising an electrode formed on a surface thereof and a hole that exposes the electrode in a opposite surface thereof. A conduction member may be inserted in the hole formed in the semiconductor chip, to bring the conduction member in contact with the electrode to thereby establish electrical conduction between the two. As a result, the path between the electrodes becomes shorter and therefore signal delays are minimized or prevented.

A semiconductor device according to another embodiment is characterized in comprising: a first semiconductor chip having an electrode formed on a surface thereof and a hole that exposes the electrode through an opposite surface thereof, and a second semiconductor chip having a protrusion for insertion in the hole of the first semiconductor chip and an abutting electrode on the protrusion for contact with the electrode. Mutual electrical conduction can be established simply by stacking the semiconductor chips in layers. Also, the chips are connected to one another by their upper and lower surfaces. As a result, there are no restrictions in the area of semiconductor chips to be stacked, and therefore semiconductor chips having the same area can be superimposed, such that the miniaturization of semiconductor devices can be achieved. In this manner, electrical conduction between the electrode and the abutting electrode is established by stacking the first semiconductor chip and the second semiconductor chip on top of the other. As a result, the path between the electrodes becomes shorter and therefore signal delays are minimized or prevented. Also, since there are no restrictions on the area of semiconductor chips to be stacked, semiconductor chips having the same area can be stacked in layers, and the size of the device main body can be reduced.

A semiconductor device in accordance with another aspect of certain embodiments is characterized in that the first semiconductor chip and the second semiconductor chip have a crystal orientation face of (100). The same crystal orientation is given to both of the semiconductor chips. As a result, an etching process forms the same cross-sectional configurations, and therefore the semiconductor chips can be engaged (superimposed) with one another without a gap. Also, the semiconductor chips have the same thermal expansion when they are formed from the same material, and thus the semiconductor chips can be securely engaged with one another even when the ambient temperature changes.

In another aspect of certain embodiments, a semiconductor device is characterized in that the first semiconductor chip and the second semiconductor chip have a crystal orientation face of (110). The same crystal orientation is given to both of the semiconductor chips, in a similar manner as the semiconductor device described in the preceding paragraph.

As a result, an etching process forms the same cross-sectional configurations, and therefore the semiconductor chips can be engaged (superimposed) with one another without a gap. Also, the semiconductor chips have the same thermal expansion when they are formed from the same material, and thus the semiconductor chips can be securely engaged with one another even when the ambient temperature changes.

In another aspect of certain embodiments, a semiconductor device is characterized in that a metal film is coherently formed on the lower surface of the electrode, and the electrode and the abutting electrode are brought in contact with each other through the metal film. When the first semiconductor chip and the second semiconductor chip are superimposed on top of the other, the occurrence of damage to the electrode, which may be caused by the abutting electrode being brought in contact with the electrode, is prevented.

In another aspect of certain embodiments, a connection substrate is characterized in that the semiconductor device set forth in any one of the preceding four paragraphs is used therein. Since the connection substrate uses the semiconductor device in which the path between the electrodes can be made shorter, and the integration efficiency and the mounting efficiency can be increased, signal delays in the connection substrate are prevented and the size of the connection substrate itself can be reduced.

In another aspect of certain embodiments, an electronic apparatus is characterized in that the connection substrate set forth in the preceding paragraph is used therein. Since the electronic apparatus uses the connection substrate in which signal delays are minimized and the size thereof can be reduced, signal delays in the electronic apparatus are inhibited or prevented and the size of the electronic apparatus itself can be reduced Certain preferred embodiments including a method for manufacturing a semiconductor chip, a method for manufacturing a semiconductor device, a semiconductor chip, a semiconductor device, a connection substrate and an electronic apparatus are described in detail with reference to the accompanying drawings.

FIG. 3(1) shows a cross-sectional view of a first semiconductor chip and a second semiconductor chip to be connected to one another in accordance with one embodiment of the present invention. As shown in FIG. 3(1), a semiconductor device 10 in accordance with this embodiment of the present invention is formed from a first semiconductor chip 12 and a second semiconductor chip 14, which are to be stacked in layers.

The first semiconductor chip 12 is preferably formed from monocrystal silicon as a base material, and the preferred crystal orientation face of the monocrystal silicon is (100). Elements such as transistors, capacitors, resistances, and the like are formed in a lower layer below a dielectric layer formed on a surface 16 of the first semiconductor chip. The elements are connected to a metal wiring formed on the surface 16 by through holes formed in the dielectric layer, such that the elements may be electrically connected to an electrode 18 formed at a tip of the metal wiring.

The electrode 18 described above preferably has a two-layered structure having a tungsten layer 20 and an aluminum layer 22 formed on an upper surface of the tungsten layer 20. The tungsten layer 20 protects the electrode 18 from damage that may be caused by an etching process to form a hole (to be described below).

A hole 26 is formed on another side of the surface of the first semiconductor chip 12 where the electrode 18 is formed, as shown in FIG. 3(1), on opposite (or lower or rear) surface 24 of the first semiconductor chip 12. At least a portion of the hole 26 illustrated in FIG. 3(1) extends in a vertical manner through the chip 12. The hole 26 preferably has a square opening and a sloped surface angled at 54.74 degree with respect to the lower surface 24 is formed at each of the edges of the opening. The tungsten layer 20 that forms the electrode 18 is exposed at a ceiling section of the hole.

A conduction member may be brought in contact with the tungsten layer 20 to establish electrical conduction with the elements formed on or below the surface 16.

A dielectric film (such as $SiO_2$) 28 is formed using tetraethylorthosilicate (TEOS) or the like over an area including the lower surface 24 and the hole 26 except the electrode 18 defining the ceiling section thereof of the first semiconductor chip 12. As a result, short circuits, which may be caused by a conduction member that is brought in contact with the lower surface 24, can be prevented.

The other semiconductor chip of the semiconductor device 10, i.e., the second semiconductor chip 14 is also preferably formed from monocrystal silicon as a base material, in a similar manner as the first semiconductor chip 12, and the preferred crystal orientation face of the monocrystal silicon is (100), in a similar manner as the first semiconductor chip 12.

The second semiconductor chip 14 thus formed is provided on its surface 31 with a protrusion 30 that is preferably capable of male-female engagement with the hole 26, and an abutting electrode 32 is formed on an apex section of the protrusion 30. The height from the surface 31 to the abutting electrode 32 is preferably the same as the height from the lower surface 24 of the first semiconductor chip 12 to the tungsten layer 20 that defines the ceiling of the hole 26, such that the tungsten layer 20 and the electrode 32 can contact each other when the first semiconductor chip 12 and the second semiconductor chip 14 are superimposed on top of the other. A metal wiring 34 is lead out from the abutting electrode 32, such that an electrical conduction to the elements formed on the surface of the first semiconductor chip 12 is established.

The first semiconductor chip 12 and the second semiconductor chip 14 thus formed are superimposed on top of the other, as shown in FIG. 3(2), to thereby form the semiconductor device 10. In the present embodiment, the first semiconductor chip 12 and the second semiconductor chip 14 may be connected to each other by conductive adhesive 36. When, for example, a pressure is applied from above and/or from below, the tungsten layer 20 and the electrode 32 are electrically connected to each other. The semiconductor device 10 thus composed does not impose restrictions on the size of the first semiconductor chip 12 or the second semiconductor chip 14. Accordingly, semiconductor chips having the same shape may be used, and thus the mounting areas can be effectively used. Also, since the signal path between the semiconductor chips can be shortened, signal delays can be inhibited or prevented.

Also, when a connection substrate uses the semiconductor device 10 described above in which the path between the electrodes can be made shorter, and the integration efficiency and the mounting efficiency can be increased, signal delays in the connection substrate are minimized or prevented and the size of the connection substrate itself can be reduced.

Furthermore, when an electronic apparatus is equipped with the connection substrate described above in which signal delays are inhibited or prevented and the size thereof can be reduced, signal delays in the electronic apparatus are inhibited or prevented and the size of the electronic apparatus itself can be reduced FIGS. 1(1)–1(4) show steps of forming the first semiconductor chip 12 in accordance with an embodiment of the present invention. FIG. 1(1) shows a monocrystal silicon layer having a crystal orientation face of (100) on its surface, and an electrode 18 formed on the monocrystal silicon layer. The electrode 18 may be electrically connected to elements, such as, for example, transistors, capacitors and resistors.

The electrode 18 may be formed in the following manner. The electrode 18 preferably has a two-layered structure having a tungsten layer 20 and an aluminum layer 22. The tungsten layer 20 may be formed in the following manner. A Ti film is formed first to a preferred thickness of 70–200 angstroms by a sputter method, and then a TiN film is deposited thereon to a preferred thickness of 300–1000 angstroms by a reactive sputter method. Then, a plasma CVD is conducted using gases containing tungsten hexafluoride ($WF_6$) as a main component gas, to thereby cover the surface 16 with tungsten that is a high-melting point metal. Then, the tungsten is etched back by a dry etching method using a mixed gas containing $SF_6$ and Ar to remove excess portions of the tungsten and leave the tungsten only in an area that defines the electrode 18, to thereby form the tungsten layer 20 that is a lower layer of the electrode 18. The excess portions of the tungsten may be removed by a CMP method instead of the etching back method.

After the tungsten layer 20 is formed, the entire monocrystal silicon wafer is preferably placed in an argon atmosphere under pressures of 2–5 mTorr at temperatures of 150–300° C., and a sputter process is conducted using a target, such as, for example, Al—Cu, Al—Si—Cu or Al—Si, with a DC input power of 9–12 kW, to form the aluminum layer 22 having the same compositions of the aforementioned target on the tungsten layer 20.

After the electrode 18 is formed over the first semiconductor chip 12, a hole 26 is formed from the surface 24 by an anisotropic etching method using an etching solution, such as, for example, KOH solution or ethylenediamine solution. Sloped sidewalls of the hole 26 are formed at an angle of 54.74 degree with respect to the lower surface 24 (in other words, the crystal orientation face of (100)). The width of the opening in the lower surface 24 is set a specified value to form the hole 26 having the uniformly angled sidewalls. When the anisotropic etching advances, the etching solution reaches the electrode 18. However, since the electrode 18 has a two-layered structure formed from the tungsten layer 20 and the aluminum layer 22, and the tungsten layer 20 is not significantly eroded by the etching solution, the tungsten 20 that forms the electrode 18 is exposed at the ceiling of the hole 26. The cross-sectional view after the etching is shown in FIG. 1(2).

After the etching is completed, a dielectric film ($SiO_2$) 28 may be formed over the opposite surface by a thermal CVD method using tetraethylorthosilicate (TEOS), as shown in FIG. 1(3). Since the dielectric film 28 is formed on the lower surface 24 of the first semiconductor chip 12, short circuits, which may be caused by a conduction member that is brought in contact with the opposite surface 24, may be prevented.

Then, the dielectric film 28 covering the tungsten layer 20 is removed by a photoresist process or the like so that the tungsten layer 20 defining the ceiling section of the hole 26 is exposed.

FIGS. 2(1)–2(4) show steps of forming the second semiconductor chip 14 that is used for the embodiment of the present invention shown in FIG. 3(2). Referring to FIG. 2(1), monocrystal silicon having a crystal orientation face of (100) on its surface is used as a substrate material, in a similar manner as the first semiconductor chip 12.

As shown in FIG. 2(2), resist 38 is coated on an area corresponding to an apex section of a protrusion 30 on a surface 31 of the substrate, and then an anisotropic etching is conducted using an etching solution such as KOH solution or ethylenediamine solution.

FIG. 2(3) shows a state in which the anisotropic etching is completed. As shown in FIG. 2(3), when an anisotropic etching is conducted with the coated resist 38, areas other than the area coated with the resist 38 are removed, and thereby the protrusion 30 that is capable of male-female engagement with the hole 26 is formed.

After the protrusion 30 is formed, the resist 38 is removed and a metal film is deposited thereon. Then, a photoresist process may be conducted and a metal wiring 34 is formed. After the metal wiring 34 is formed, the entire monocrystal silicon wafer is placed in an argon atmosphere under pressures of 2–5 mTorr at temperatures of 150–300° C., and a sputter process is conducted using a target, such as, for example, Al—Cu, Al—Si—Cu or Al—Si, with a DC input power of 9–12 kW, to form an abutting electrode 32 having the same compositions of the aforementioned target.

In the embodiment shown in FIG. 3(2), the first semiconductor chip 12 and the second semiconductor chip 14 use monocrystal silicon having a crystal orientation face of (100) on their surfaces. However, it is not limited to this particular crystal orientation, and, for example, monocrystal silicon having a crystal orientation face of (110) can be used for the first semiconductor chip 12 and the second semiconductor chip 14. FIGS. 4(1)–4(4) show manufacturing steps in which monocrystal silicon having a crystal orientation face of (110) is used for the first semiconductor chip 12. As shown in the figures, a hole 26 does not have sloped surfaces, but the hole 26 similarly has a ceiling section that exposes the tungsten layer 20.

Figure 1:
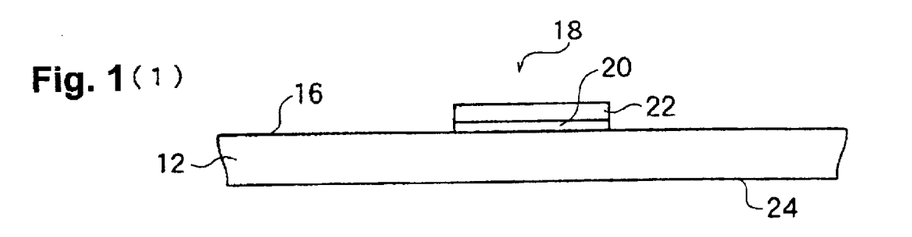
Figure 2:
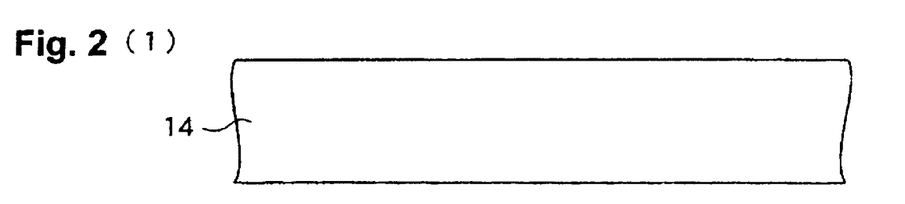
Figure 3:
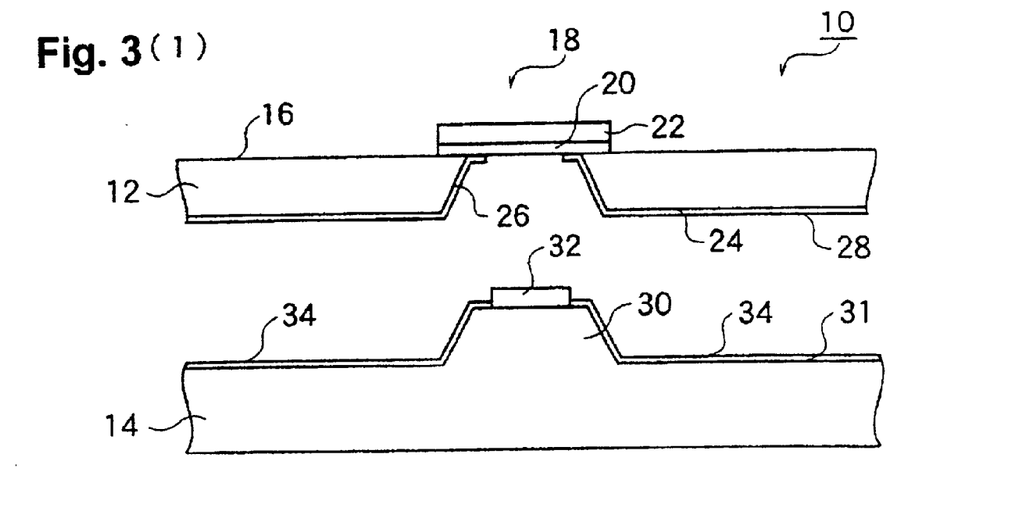
Figure 4:
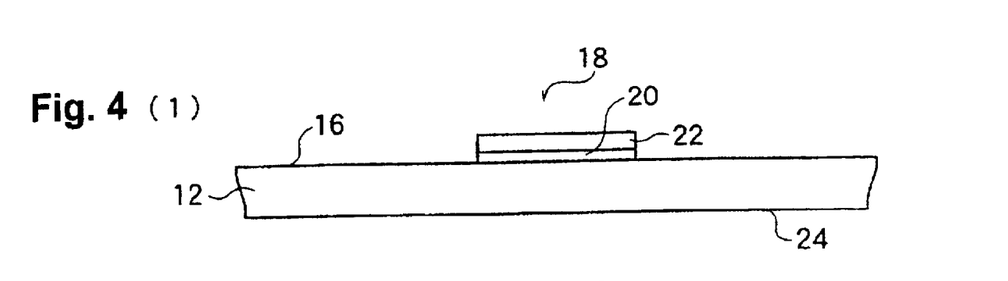
Figure 5:
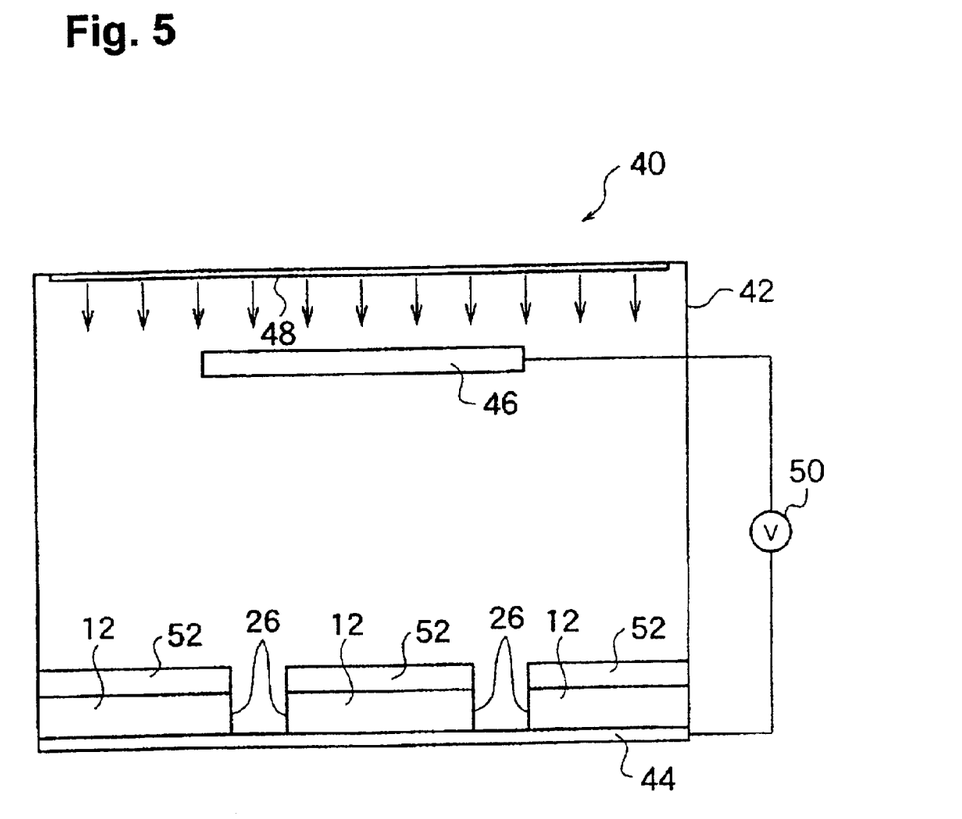
FIG. 5 shows an apparatus structure in which holes 26 are formed by an anodic forming method in a first semiconductor chip 12 that has N-type monocrystal silicon as a base material in accordance with an embodiment of the present invention.
Figure 6:
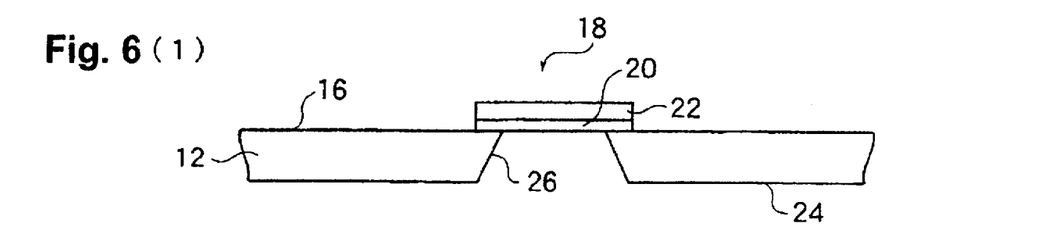

The hole 26 in the first semiconductor chip 12 shown in FIGS. 4(1)–4(4) is formed by an anisotropic etching method. However, other methods can also be used instead. FIG. 5 shows an apparatus structure that is used when holes 26 are formed by an anodic forming method in a first semiconductor chip 12 that uses N-type monocrystal silicon as a substrate material.

As shown in the embodiment illustrated in FIG. 5, an anodic formation apparatus 40 is formed from a container 42 that is capable of charging hydrofluoric acid therein, an electrode 46 that is disposed in an upper portion of the container 42 in a manner to oppose the bottom of the container 42, a lamp 48 that is disposed above the electrode 46 and capable of irradiating the container bottom, and a power supply source 50 that applies a voltage between the electrode 46 and a first semiconductor chip 12 that is brought in the anodic formation apparatus 40. The first semiconductor chip 12 that is brought in the anodic formation apparatus 40 is in a state in which a dielectric film 52 (which may in certain embodiments be a resist layer) is formed in areas other than those areas where holes 26 are formed. The first semiconductor chip 12 with the dielectric film 52 formed thereon is disposed on the bottom of the contain 42, and hydrofluoric acid is introduced in the container 42. Then, the surface in which the dielectric film 52 is formed is irradiated by the lamp 48, and a voltage is applied by the power supply source 50 between the electrode 46 and a platinum electrode 44 that defines an electrode of the first semiconductor chip 12. By this process, areas in the opposite surface of the first semiconductor chip 12 that are not covered by the dielectric film 52, in other words, regions where the holes 26 are to be formed, are cut. As a result, the holes 26 are formed. When an anodic formation is used to form the holes 26 in this manner, the time for forming the holes 26 may be substantially shortened, compared to the step of forming the holes 26 by an etching method.

After the holes 26 are formed, the platinum electrode 44 is removed, a sputtering or the like may be conducted to newly form an aluminum electrode, the dielectric film 52 is removed from the opposite surface 24, and a dielectric film (SiO$_2$) 28 is newly formed by a thermal CVD method using tetraethylorthosilicate (TEOS).

FIGS. 6(1)–6(4) show manufacturing steps of forming a metal film within the hole 26 in the first semiconductor chip in accordance with an embodiment of the present invention.

FIG. 6(1) shows a cross-sectional view of the first semiconductor chip 12 in a state after the electrode 18 and the hole 26 are formed. When the electrode 18 and the hole 26 are formed, a dielectric film (SiO$_2$) 28 is formed by a thermal CVD method using tetraethylorthosilicate (TEOS), as shown in FIG. 6(2). After the dielectric film 28 is formed, a metal film 54 is formed on the inside of the hole 26, as shown in FIG. 6(3). The metal film 54 may be formed by the following method. The first semiconductor chip 12 is placed in an argon atmosphere under pressures of 2–5 mTorr at temperatures of 150–300° C., and a sputter process is conducted using a target, such as, for example, Al—Cu, Al—Si—Cu or Al—Si, with a DC input power of 9–12 kW, to form the metal film 54 having the same compositions of the aforementioned target. When the first semiconductor chip 12 with the metal film 54 formed thereon and the second semiconductor chip 14 are stacked on top of the other, the abutting electrode 32 provided on the protrusion 30 of the second semiconductor chip 14 contacts the metal film 54. As a result, the occurrence of damage to the electrode 18, which may be caused by the abutting electrode 32, is prevented. Consequently, the electrode 18 is protected when the chips are stacked in layers.

In accordance with certain embodiments, after an electrode is formed on a surface of a semiconductor chip, a hole is dug from another surface of the semiconductor chip until the electrode is exposed. As a result, the electrical path becomes shorter and therefore signal delays are prevented.

Also, in accordance with certain embodiments, after forming an electrode on a surface of a first semiconductor chip and thereafter digging a hole from another surface of the first semiconductor chip until the electrode is exposed, a protrusion is formed by etching on a surface of a second semiconductor chip and thereafter an abutting electrode is formed on an apex section of the protrusion. Then, the first semiconductor chip and the second semiconductor chip are stacked on top of the other such that the abutting electrode contacts the electrode. As a result, electrical conduction between the electrodes of the semiconductor chips is securely established, the signal path is made shorter by stacking the semiconductor chips in layers, and therefore signal delays are inhibited or prevented.

Also, in certain embodiments, a metal film is formed on a surface of a first semiconductor chip, a hole is then formed by an anodic forming method using a dielectric layer such as resist coated on an opposite surface of the first semiconductor chip as a mask. Then, the metal film is removed, and an electrode is formed on a surface of the first semiconductor chip in a manner to embed the hole. In this manner, an anodic forming method is used to form the hole. As a result, the time required for forming the hole may be substantially shortened (for example, as compared to the etching speed).

It is noted that in certain embodiments, the semiconductor chip has an electrode formed on a surface thereof and a hole that exposes the electrode in a opposite surface thereof. As a result, the electrical path becomes shorter and therefore signal delays are prevented.

A semiconductor device may in certain embodiments include a first semiconductor chip having an electrode formed on a surface thereof and a hole that exposes the electrode in an opposite surface thereof, and a second semiconductor chip having a protrusion for insertion in the hole of the first semiconductor chip and an abutting electrode on the protrusion for contact with the electrode. As a result, the same effects as described above may be obtained. Namely, the path between the electrodes becomes shorter and the size of the device main body in which the semiconductor chips are stacked can be reduced.

When a connection substrate uses the semiconductor device according to certain embodiments of the present invention, signal delays are prevented by the shortened path between the electrodes, and the size of the connection substrate itself can be reduced.

Furthermore, in an electronic apparatus using the connection substrate in accordance with certain embodiments, effects similar to those obtained by the connection substrate can be achieved, namely, signal delays are prevented by the shortened path between the electrodes, and the size of the connection substrate itself can be reduced.

What is claimed:

1. A method for manufacturing a semiconductor chip, the method comprising forming a multi-layer electrode on a first surface of a semiconductor chip, the electrode formed to include a first conducting layer and a second conducting layer formed in direct contact with the first conducting layer, wherein the first conducting layer is positioned between the second conducting layer and the first surface of the semiconductor chip, and then digging a hole from a second surface of the semiconductor chip until the electrode is exposed.

2. A method as in claim 1, wherein the second surface is located opposite to the first surface.

3. A method as in claim 2, wherein the hole contacts the first layer of the electrode and does not contact the second layer of the electrode.

4. A method for manufacturing a semiconductor device according to claim 2, wherein, after the hole is formed, a metal film is formed on the electrode through the hole.

5. A method for manufacturing a semiconductor device according to claim 3, wherein, after the hole is formed, a metal film is formed on the first layer of the electrode through the hole so that the first layer of the electrode is positioned between the metal film and the second layer of the electrode.

6. A method as in claim 1, wherein the first conducting layer comprises tungsten, and wherein the first conducting layer is exposed during the digging a hole from a second surface of the semiconductor chip until the electrode is exposed.

7. A method as in claim 6, wherein the second conducting layer comprises aluminum.

8. A method for manufacturing a semiconductor chip, the method comprising: forming an electrode on a first surface of a first semiconductor chip and thereafter forming a hole from a second surface of the first semiconductor chip until the electrode is exposed, forming a dielectric layer on the second surface of the first semiconductor chip and on the first semiconductor chip in the hole, wherein the dielectric layer has an opening and the electrode is exposed through the opening, forming a protrusion by etching a surface of a second semiconductor chip and thereafter forming an abutting electrode on an apex section of the protrusion, and positioning the first semiconductor chip and the second semiconductor chip such that the abutting electrode is in electrical contact with the electrode through the opening.

9. A method as in claim 8, wherein forming a hole from another surface comprises forming the hole from a surface that is opposite to the surface the electrode was formed on.

10. A method for manufacturing a semiconductor device, the method comprising: forming a metal film on a surface of a first semiconductor chip, forming a hole by an anodic forming method using a dielectric layer coated on an opposite surface of the first semiconductor chip as a mask, thereafter removing the metal film, and forming a multi-layer electrode on a portion of the surface of the first semiconductor chip in a manner to embed the hole.

11. A method for forming a semiconductor device comprising:
   forming a first electrode on a first surface of a first substrate;
   forming a hole from a second surface of the first substrate to the first surface, wherein a portion of the first electrode is exposed through the hole, wherein the hole is defined by an interior surface of the first substrate and the exposed portion of the first electrode;
   forming a second electrode on a second substrate;
   forming a dielectric layer on the interior surface of the first substrate, the dielectric layer having an opening therein, and positioning the dielectric layer so that a portion of the first electrode is exposed through the opening; and
   positioning the second electrode in the opening and electrically connecting the first electrode to the second electrode through the opening.

12. A method for manufacturing a semiconductor device, comprising:
   providing a first substrate comprising a semiconductor chip having a first surface and a second surface opposite the first surface;
   forming a first electrode on the first surface of a semiconductor chip, the electrode including a first electrode surface in contact with the semiconductor chip;
   removing a portion of the semiconductor chip from the second surface of the semiconductor chip to form a hole extending through the semiconductor chip, the hole being defined by interior sidewalls of the semiconductor chip and an exposed portion of the first electrode;
   forming a dielectric layer on the interior sidewalls of the semiconductor chip, wherein the dielectric layer is formed to include an opening and a portion of the first electrode surface is exposed through the opening;
   providing a second substrate having an second electrode thereon, the second electrode extending a distance above a first surface of the second substrate; and
   positioning the second electrode within the hole and in electrical contact with the first electrode.

13. A method as in claim 12, wherein a portion of the second substrate is positioned within the hole.

14. A method as in claim 12, wherein the second substrate comprises a semiconductor chip and a portion of the semiconductor chip is positioned within the hole.

15. A method as in claim 14, wherein the second electrode is formed on a first surface of the second substrate, further comprising:
   forming a conducting lead extending from the second electrode on the first surface of the second substrate; and
   forming the dielectric layer on the interior sidewalls to also extend on the second surface of the first substrate.

16. A method as in claim 15, further comprising forming a conducting material within the opening between the first electrode and the second electrode.

17. A method as in claim 15, further comprising forming a metal layer on the first electrode through the opening, prior to the positioning the second electrode within the hole.

18. A method as in claim 12, where the interior sidewalls are formed so that an angle at an intersection of an interior sidewall and the second surface is 90 degrees.

19. A method as in claim 12, where the interior sidewalls are formed so that an angle at an intersection of an interior sidewall and the second surface is 54.74 degrees.

20. A method as in claim 12, wherein the removing a portion of the semiconductor chip from the second surface of the semiconductor chip is carried out using an anisotropic etching technique.

21. A method for manufacturing a semiconductor device, comprising:
   providing a first substrate comprising a semiconductor chip having a first surface and a second surface opposite the first surface;
   forming a first electrode on the first surface of a semiconductor chip, the electrode including a first electrode surface in contact with the semiconductor chip; wherein the first electrode includes a first layer comprising tungsten and a second layer comprising aluminum, wherein the first electrode surface is part of the first layer;
   removing a portion of the semiconductor chip from the second surface of the semiconductor chip to form an opening extending through the semiconductor chip and extending to the first electrode surface, the opening being defined by interior sidewalls of the semiconductor chip and an exposed portion of the first electrode;
   providing a second substrate having an second electrode thereon, the second electrode extending a distance above a first surface of the second substrate; and
   positioning the second electrode within the opening and in electrical contact with the first electrode.

22. A method for manufacturing a semiconductor device, comprising:
   providing a first substrate comprising a semiconductor chip having a first surface and a second surface opposite the first surface;
   forming a first electrode comprising platinum on the first surface of a semiconductor chip, the electrode including a first electrode surface in contact with the semiconductor chip;
   placing the first substrate into a processing container having a processing electrode and a lamp therein, wherein the first substrate is spaced apart from the processing electrode and the lamp;
   forming a patterned dielectric layer so that the second surface includes a masked portion and an exposed portion;
   introducing an acid into the container;
   irradiating the second surface with the lamp;
   applying a voltage between the processing electrode and the first electrode; and
   forming an opening that extends through the semiconductor chip through the exposed portion of the second surface.

23. A method as in claim 22, further comprising:
   removing the first electrode comprising platinum from the first surface of the semiconductor chip;
   forming an aluminum electrode on the first surface of the semiconductor chip that covers the opening;

removing the patterned dielectric layer from the second surface; and forming a thermal oxide on the second surface.

24. A method as in claim 22, wherein the opening includes sidewalls, and an angle between the sidewalls and the second surface is 90 degrees.

25. A method as in claim 22, further comprising forming the patterned dielectric layer so that the exposed portion of the second surface includes a plurality of exposed regions and the masked portion includes a plurality of masked regions, and the plurality of exposed regions are separated from one another by the masked regions, and wherein a plurality of openings that extend through the semiconductor chip through the exposed regions are formed.

26. A method as in claim 10, wherein the forming a hole by an anodic forming method includes providing a container into which the first semiconductor chip is placed, providing an electrode in the container that is not in direct physical contact with the first semiconductor chip, introducing an acid into the container, and applying a voltage between the metal film on the surface of the first semiconductor chip and the electrode in the container.

* * * * *